(12) United States Patent
Kim et al.

(10) Patent No.: US 9,903,925 B2
(45) Date of Patent: Feb. 27, 2018

(54) LOW-FIELD NUCLEAR MAGNETIC RESONANCE DEVICE AND LOW-FIELD NUCLEAR MAGNETIC RESONANCE METHOD

(71) Applicant: Korea Research Institute of Standards and Science, Daejeon (KR)

(72) Inventors: Ki Woong Kim, Daejeon (KR); Seong-Joo Lee, Daejeon (KR); Chan Seok Kang, Daejeon (KR); Seong-min Hwang, Daejeon (KR); Yong-Ho Lee, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 1271 days.

(21) Appl. No.: 13/921,724

(22) Filed: Jun. 19, 2013

(65) Prior Publication Data

US 2013/0278265 A1 Oct. 24, 2013

Related U.S. Application Data

(63) Continuation of application No. PCT/KR2011/000961, filed on Feb. 14, 2011.

(30) Foreign Application Priority Data

Jan. 3, 2011 (KR) .................. 10-2011-0000288

(51) Int. Cl.
*G01V 3/00* (2006.01)
*G01R 33/36* (2006.01)
*G01R 33/28* (2006.01)
*G01R 33/44* (2006.01)
*G01R 33/62* (2006.01)
*G01R 33/30* (2006.01)
*G01R 33/32* (2006.01)
*G01R 33/48* (2006.01)

(52) U.S. Cl.
CPC .......... *G01R 33/36* (2013.01); *G01R 33/282* (2013.01); *G01R 33/445* (2013.01); *G01R 33/62* (2013.01);

(Continued)

(58) Field of Classification Search
CPC .................................................... G01R 33/282
(Continued)

(56) References Cited

U.S. PATENT DOCUMENTS 7,372,274 B2 * 5/2008 Ardenkjaer-Larsen ................. G01R 33/282 324/307
7,573,264 B2 8/2009 Xu et al.
(Continued)

FOREIGN PATENT DOCUMENTS

| JP | 2003-035758 | 7/2003 |
| JP | 2004-512537 | 4/2004 |
| WO | 2009/029241 | 3/2009 |

OTHER PUBLICATIONS

English Translation of the International Search Report with Written Opinion for PCT/KR2011/000961 dated Feb. 6, 2012.
(Continued)

*Primary Examiner* — Louis Arana
(74) *Attorney, Agent, or Firm* — Jenkins, Wilson, Taylor & Hunt, P.A.

(57) ABSTRACT

Provided are a low-field nuclear magnetic resonance device and a low-field nuclear magnetic resonance method. The low-field nuclear magnetic resonance device includes a dynamic nuclear polarization (DNP) amplification unit to amplify the nuclear polarization of hydrogen atoms of water using a DNP-possible substance (DNP substance) to provide the amplified nuclear polarization to a measurement target, a sensor unit to measure a magnetic resonance signal of the measurement target using a SQUID sensor or an optically-pumped atomic magnetometer, and a measurement field coil to apply a measurement field to the measurement target. The DNP amplification unit is separated from the measurement target, the sensor unit, and the measurement field coil.

17 Claims, 8 Drawing Sheets

(52) U.S. Cl.
CPC .......... *G01R 33/307* (2013.01); *G01R 33/326* (2013.01); *G01R 33/3607* (2013.01); *G01R 33/4826* (2013.01)

(58) Field of Classification Search
USPC ................................ 324/300, 304, 307, 309
See application file for complete search history.

(56) References Cited

U.S. PATENT DOCUMENTS

| | | | |
|---|---|---|---|
| 7,906,962 B2 * | 3/2011 | Han ..................... | G01R 33/282 324/300 |
| 8,154,292 B2 * | 4/2012 | Bovier ................... | G01R 33/30 324/318 |
| 8,456,161 B2 * | 6/2013 | Happer ................ | G01R 33/282 324/300 |
| 9,140,657 B2 * | 9/2015 | Ledbetter ............... | G01N 24/08 |
| 9,329,246 B2 * | 5/2016 | Jannin .................. | G01R 33/282 |

OTHER PUBLICATIONS

International Search Report for PCT/KR2011/000961 dated Feb. 6, 2012.

\* cited by examiner

LOW-FIELD NUCLEAR MAGNETIC RESONANCE DEVICE AND LOW-FIELD NUCLEAR MAGNETIC RESONANCE METHOD

CROSS-REFERENCE TO RELATED APPLICATIONS

This application is a continuation of and claims priority to PCT/KR2011/000961 filed on Feb. 14, 2011, which claims priority to Korea Patent Application No. 10-2011-0000288 filed on Jan. 3, 2011, the entireties of which are both hereby incorporated by reference.

BACKGROUND OF THE INVENTION

1. Field of the Invention

The present invention relates to nuclear magnetic resonance devices and, more particular, to a low-field nuclear magnetic resonance device.

2. Description of the Related Art

When a nuclear spin of atoms constituting a substance is under an external magnetic field, the nuclear spin performs a precession around the external magnetic. In this case, if a specific radio frequency (RF) that is in proportion to the external magnetic field is externally applied, a resonance phenomenon is observed. This is called a nuclear magnetic resonance (NMR). Magnetic resonance imaging (MRI) is a technique for non-invasively imaging the inner part of an imaging object using the NMR. The MRI has been widely used as a medical diagnostics tool for imaging the inner part of human body.

Unlike conventional NMR/MRI systems operating under a strong magnetic field with the magnitude of several Tesla (T) to tens of T, ultra-low field (ULF) NMR/MRI systems are new-concept NMR/MRI systems operating under a magnetic field with the magnitude of several microTesla ($\mu T$) to tens of $\mu T$.

In the ULF-MRI system, a SQUID sensor is used to obtain a magnetic resonance signal under such a weak magnetic field, unlike conventional NMR/MRI systems. Since the SQUID sensor has very high sensitivity, an NMR signal under a magnetic field of several $\mu T$ can be observed. The SQUID sensor measures superconducting screening current induced on a pickup coil. The measured signal does not have frequency dependence, therefore, unlike commercial NMR/MRI systems using an inductive coil. For this reason, the signal is not significantly reduced even under a low magnetic field. In addition, the SQUID sensor may be replaced by an optically-pumped atomic magnetometer which has the sensitivity comparable to that of the SQUID sensor.

However, the SQUID sensor is very sensitive to the fluctuation of an external magnetic field. Thus, a typical magnetic field of several to tens of Tesla cannot be used. Whereas, the magnetic field of several to tens of microTesla is not sufficient to magnetize a nuclear spin. Thus, the ULF-MRI system includes a prepolarization magnetic field and a measurement magnetic field. The magnitude of the prepolarization magnetic field is tens of milliTesla (mT) to hundreds of mT, and the magnitude of the measurement magnetic field is several $\mu T$ to tens of $\mu T$.

The greater the magnitude of a prepolarization, the higher MRI imaging sensitivity. Therefore, it is advantageous to apply a large magnetic field. However, since a large magnetic field requires large current of tens to hundreds of amperes (A), there are many difficulties in implementing a driving circuit of a prepolarization coil to form the prepolarization magnetic field and cooling the prepolarization coil. Moreover, there is a spatial limitation in applying a large prepolarization magnetic field. The prepolarization coil may cause electrical interference with the SQUID sensor, and the development cost of the prepolarization coil is high. Accordingly, there is a need for a low-field nuclear magnetic resonance device that does not require the prepolarization coil.

SUMMARY OF THE INVENTION

Embodiments of the present invention provide a low-field NMR/MRI apparatus which is capable of obtaining a magnetic resonance signal through signal amplification using dynamic nuclear polarization (DNP) without a prepolarization magnetic field.

Embodiments of the present invention provide a low-field NMR/MRI method which is capable of obtaining a magnetic resonance signal through signal amplification using DNP without a prepolarization magnetic field.

According to an embodiment of the present invention, a low-field nuclear magnetic resonance device may include a dynamic nuclear polarization (DNP) amplification unit to amplify the nuclear polarization of hydrogen atoms of water using a DNP-possible substance (DNP substance) to provide the amplified nuclear polarization to a measurement target, a sensor unit to measure a magnetic resonance signal of the measurement target using a SQUID sensor or an optically-pumped atomic magnetometer, and a measurement magnetic field coil to apply a measurement magnetic field to the measurement target. The DNP amplification unit includes a bias magnetic field coil to apply a bias magnetic field to the DNP substance and the water, a filter unit disposed inside the bias magnetic field coil and including a gel-filtration matrix to provide the amplified nuclear polarization of the water to the measurement target, and an RF resonance circuit part including an RF resonance coil disposed around the gel-filtration matrix. The DNP amplification unit is separated from the measurement target, the sensor unit, and the measurement magnetic field coil.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present invention.

DETAILED DESCRIPTION OF EMBODIMENTS

Figure 1:
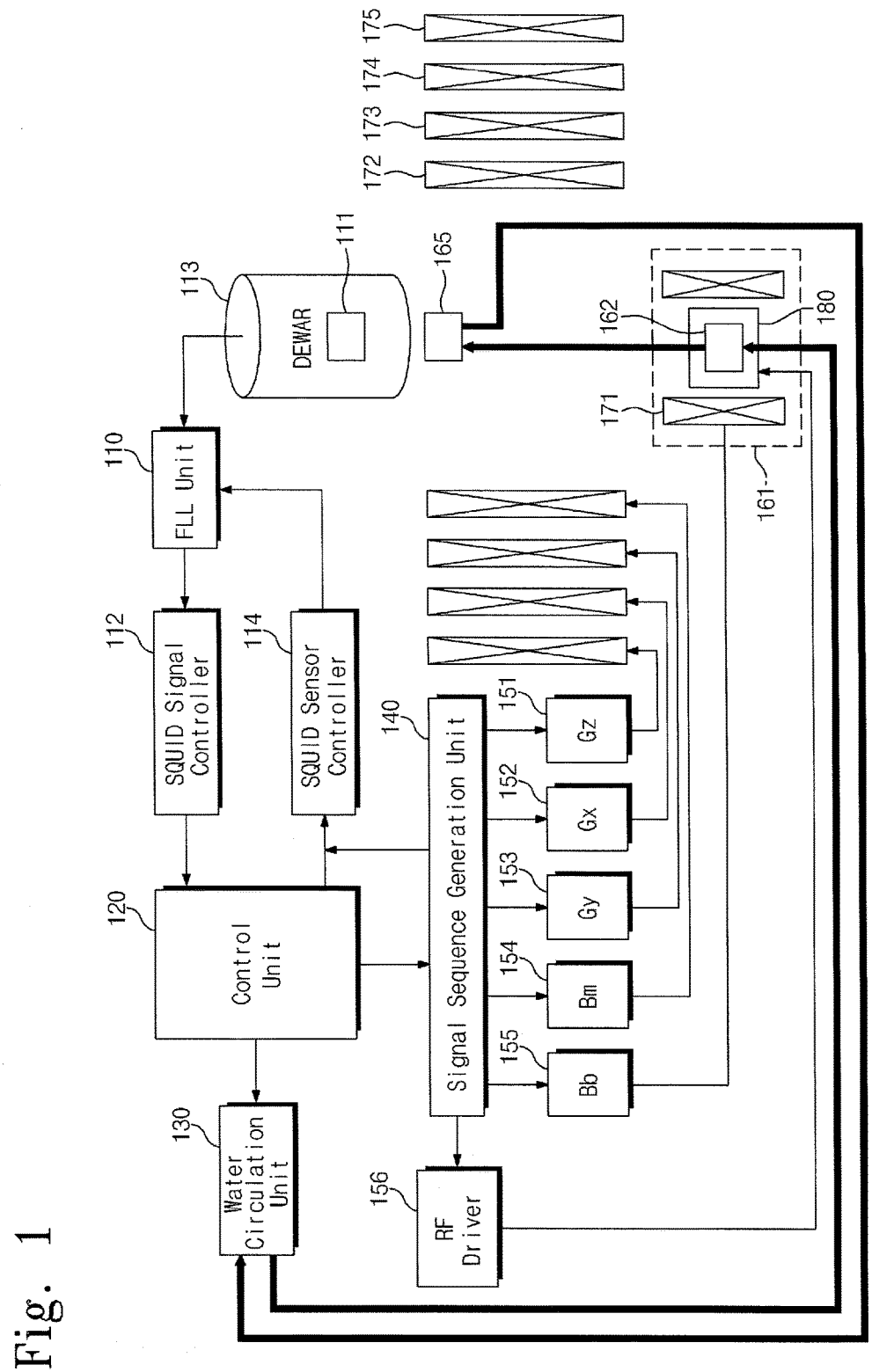
FIG. 1 illustrates a low-field nuclear magnetic resonance device according to an embodiment of the present invention.

Dynamic nuclear polarization (DNP) based on the Overhauser double resonance effect is a result caused by cross relaxation from electron spin to nuclear spin. Accordingly, when an RF magnetic field for saturating the electron energy level is applied, a difference between nuclear spin level populations is raised to result in larger nuclear polarization.

A DNP-possible substance (hereinafter referred to as "DNP substance") is a free-radical-containing substance. The DNP substance may include 4-amino-2,2,6,6-tetramethylpiperidine-1-oxyl (TEMPO) or 4-hydroxy-2,2,6,6-tetramethylpiperidine-1-oxyl (TEMPOL).

A DNP low-field nuclear resonance device according to an embodiment of the present invention includes a filter in which a DNP substance containing free radicals is disposed to make DNP possible. An RF magnetic field for saturating the electron energy level is applied around the filter to amplify the nuclear polarization of hydrogen atoms of water passing through the filter. The amplified nuclear polarization is provided to a measurement target, allowing the measurement target to provide a nuclear magnetic resonance signal without applying a prepolarization magnetic field. Thus, the above-mentioned disadvantages caused by the prepolarization magnetic field may be overcome.

A DNP low-field nuclear resonance device according to an embodiment of the present invention may obtain a signal that is several times to several hundred times larger than a signal under a conventional prepolarization magnetic field. An RF magnetic field and a bias magnetic field amplify a pure water signal using a DNP substance to be used in biological imaging. The amplified water is supplied to the measurement target. The measurement target provides a nuclear resonance signal under a measurement magnetic field.

The bias magnetic field may have the magnitude of several milliTesla (mT), and the measurement magnetic field may have the magnitude of several microTesla ($\mu$T). Thus, a SQUID sensor or an optically-pumped atomic magnetometer measures the nuclear magnetic resonance signal. However, the SQUID sensor or the optically-pumped atomic magnetometer may be separated from a resonance coil to establish an RF magnetic field and a bias magnetic field coil to establish a bias magnetic field. Thus, the SQUID sensor may avoid interference of the RF magnetic field and the bias magnetic field.

A low-field nuclear magnetic resonance device according to an embodiment of the present invention may provide biological images by amplifying a nuclear signal of hydrogen atoms of pure water passing through a gel-filtration matrix including a DNP substance containing immobilized free radicals. The DNP substance may not be provided to a measurement target because it is filtrated by a DNP filter. As a result, this technique may be harmlessly applied to human bodies.

The present invention will now be described more fully hereinafter with reference to the accompanying drawings, in which preferred embodiments of the present invention are shown. However, the present invention may be embodied in many different forms and should not be construed as limited to the embodiments set forth herein. Rather, these embodiments are provided so that this disclosure will be thorough and complete, and will fully convey the scope of the present invention to those skilled in the art. Like numbers refer to like elements throughout.

FIG. 1 illustrates a low-field nuclear magnetic resonance device according to an embodiment of the present invention.

Referring to FIG. 1, a low-field magnetic resonance device includes a DNP amplification unit 161 to provide amplified nuclear polarization of hydrogen atoms of water to a measurement target 165 by using a DNP substance, a SQUID sensor unit 111 to measure a magnetic resonance signal of the measurement target 165, a dewar 113 to cool the SQUID sensor unit 111, and a measurement magnetic field coil 172 to apply a measurement magnetic field to the measurement target 165.

The Dewar 113 may contain liquid helium therein. The SQUID sensor unit 111 is disposed inside the Dewar 113 to dip into the liquid helium. A SQUID signal is transmitted through a flux locked loop (hereinafter referred to as "FLL") unit 110. The SQUID signal is transmitted to a control unit 120 through a SQUID signal controller 112. The FLL unit 110 is controlled through a SQUID sensor controller 114 or a signal sequence generator 140.

The SQUID sensor unit 111 may include a flux converter (not shown) to sense and/or attenuate/amplify a flux and a SQUID (not shown) to receive an output signal of the flux converter such that a magnetic field is detected to be converted into a voltage signal.

The FLL unit 110 may linearize the voltage signal of the SQUIID and provide the linearized signal as a voltage signal that is in proportion to the detected magnetic field. The FLL unit 110 may output the amount of change of the flux after converting the amount of change of the flux into a voltage signal with much wider range than a flux quantum value $\Phi_0$.

The SQUID signal controller 112 may process the linearized voltage signal of the FLL unit 110 to remove a noise and amplify it. The FLL unit 110 may include an input terminal to receive an output signal of the SQUID, an integrator, a feedback linearization circuit, and a feedback coil.

The SQUID sensor controller 114 may provide a control signal to the FLL unit 110.

The SQUID is a type of transducer for converting variation of an external flux by combination of the Josephson effect and flux quantization that only superconductors exhibit. The SQUID is a magnetic sensor that consists of one or two Josephson junctions inserted into a single superconducting loop. A RF SQUID is a magnetic sensor that consists of one Josephson junction inserted into a single superconducting loop, while a DC SQUID is a magnetic sensor that consists of two Josephson loops inserted into a single superconducting loop. A DROS SQUID is a magnetic sensor that consists of not only two Josephson junctions inserted into a single superconducting loop but also a reference junction which is connected with the superconducting loop in series and a relaxation oscillation resonance circuit. The reference junction may be a superconductor loop into which two Josephson junctions are inserted and combined or a Josephson junction. The RF SQUID operates in the manner that an AC voltage of RF frequency band is output and its frequency varies depending on an applied flux. The DC SQUID and the DROS SQUID operate in the manner that a DC voltage is generated as a function of an applied flux. The function is given in the form of a function repeated in cycles of $\Phi_0$ (=$2.07 \times 10^{-15}$ Wb) that is a quantum value of the flux. The detailed form of the flux/voltage conversion function may be decided depending on detailed structures of the DC SQUID and the DROS SQUID.

The DNP amplification unit 161 includes a bias magnetic field coil 171 to apply a bias magnetic field Bb to the DNP substance and water, a filter unit 162 including a gel-filtration matrix to provide amplified nuclear polarization of hydrogen atoms of the water to a measurement target 165 and being disposed inside the bias magnetic field coil 171, a water circulation unit 130 to supply water to the gel-filtration matrix, and an RF resonance circuit part 180 including an RE resonance coil disposed around the gel-filtration matrix.

In the low-field magnetic resonance device, there are only a measurement magnetic field Bm and/or gradient magnetic fields Gx, Gy, and Gz at the location of the measurement target 165. The low field magnetic resonance device may obtain a magnetic resonance signal that is amplified without a prepolarization magnetic field Bp of a conventional ULF-NMR/MRI system. The magnitude of the bias magnetic field Bb may about several mT for the nuclear polarization of the DNP substance.

The bias magnetic field coil 171 may be in the form of coil surrounding the filter unit 162. The bias magnetic field coil establishes a bias magnetic field Bb and applies the bias magnetic field Bb to the filter unit 162. The direction of the bias magnetic field Bb may be horizontal or perpendicular to that of an RF magnetic field established by the RF resonance coil.

The filter unit 162 may include a gel-filtration matrix where the DNP substance is fixed, a DNP filter to prevent permeation of the DNP substance, an inlet to receive water, and an outlet to supply the water to the measurement target.

The gel-filtration matrix may fix the DNP substance using fixing means. The DNP substance may be a TEMPO or a TEMPOL.

For example, the gel-filtration matrix may fix an $NH_2$ group of the TEMPO or an OH group of the TEMPOL using a Sepharose that is a kind of carriers for gel-filtration. More specifically, the gel-filtration matrix may use the NHS activated Sepharose 4 Fast Flow as a material to fix the TEMPO. Alternatively, the gel-filtration matrix may be the epoxy-activated Sepharose 6B as a material to fix the TEMPO and the TEMPOL.

The water which has the amplified nuclear-polarization by passing through the gel-filtration matrix may be continuously or intermittently supplied to the measurement target. The gel-filtration matrix includes a DNP substance making dynamic nuclear polarization (DNP) possible. An RF magnetic field of the RF resonance circuit part and a bias magnetic field of the bias magnetic field coil generate high electron spin polarization by letting unpaired electrons and nitrogen nucleus of TEMPOL and TEMPOL free radicals in the gel-filtration matrix react to each other. The electron spin polarization amplifies the nuclear polarization of hydrogen atoms of water passing through the gel-filtration matrix.

The RF resonance circuit part establishes an RF magnetic field. A driving frequency of the RF magnetic field corresponds to an electron spin resonance (ESR) frequency of the DNP substance. The driving frequency is in proportion to the magnitude of an applied bias magnetic field Bb. The driving frequency may be tens to hundreds of MHz when the bias magnetic field Bb is several mT.

The water circulation unit 130 may circulate water by supplying the water to the measurement target 165 through the filter unit 162. The water circulation unit 130 may control a flow rate of the water. The water circulation unit 130 may be controlled through the control unit 120. The water passing through the gel-filtration matrix may be continuously or discontinuously injected to the measurement target 165.

The low-field nuclear magnetic resonance device may include a control unit 120, a signal sequence generation unit 140, an RF driver 156, gradient magnetic field drivers 151, 152, and 153, a bias magnetic field driver 155, and a measurement magnetic field driver 154.

All the controls may be done using a computer program. The control unit 120 includes the FLL unit 110, the SQUID sensor controller 114, the SQUID signal controller 112, the signal sequence generation unit 140, and the water circulation unit 130.

The signal sequence generation unit 140 generates a signal sequence by a predetermined order. According to the signal sequence, the signal sequence generation unit 140 controls a first gradient magnetic field driver 152, a second gradient magnetic field driver 153, and the third gradient magnetic field driver 151 to establish first to third gradient magnetic fields Gx, Gy, and Gz.

The first gradient magnetic field driver 152 may establish the first gradient magnetic field Gx by applying current to a first gradient magnetic field coil 174. The second gradient magnetic field driver 153 may establish the second gradient magnetic field Gy by applying current to a second gradient magnetic field coil 173. The third gradient magnetic field driver 151 may establish the third gradient magnetic field Gz by applying current to a third gradient magnetic field coil 175.

According to the signal sequence, the bias magnetic field driver 155 may establish a bias magnetic field Bb by applying current to the bias magnetic field coil 171.

According to the signal sequence, the measurement field driver 154 may establish a measurement magnetic field Bm by applying current to the measurement magnetic field coil.

According to the signal sequence, the RF driver 156 establishes an RF magnetic field by applying current to the RF resonance circuit part 180. The RF magnetic field may be applied to a gel-filtration matrix or water passing through the gel-filtration matrix.

A bias magnetic field Bb and an RF magnetic field are always simultaneously turned on/off. The bias magnetic field coil 171, the measurement magnetic field coil 172, the first gradient magnetic field coil 174, the second gradient magnetic field coil 173, the third gradient magnetic field coil 175, and the RF resonance coil may be driven according to a predetermined signal sequence. A nuclear spin signal of hydrogen atoms of the water passing through the gel-filtration matrix may be amplified by the RF magnetic field of the RF resonance circuit part 180 and the bias magnetic field Bb of the bias magnetic field coil 171. Thus, the water supplied to the measurement target may provide an amplified magnetic resonance signal.

The magnitude of the bias magnetic field Bb is about several mT. The magnitude of the measurement magnetic field Bm is about several to tens of $\mu T$ and may be spatially uniform. The magnitude of a magnetic field of a gradient magnetic field coil for three-dimensional imaging may be about several to hundreds of $\mu T$ within several to tens of centimeters (cm).

The measurement magnetic field coil 172 may establish a spatially uniform and low measurement magnetic field Bm. The directions of the bias magnetic field Bb and the measurement magnetic field may be perpendicular to each other. In addition, the directions of the bias magnetic field Bb and the RF magnetic field may be perpendicular or horizontal to each other.

The DNP amplification unit 161 may be preferably spaced apart from the measurement target 165 within several meters. Accordingly, the amplified nuclear polarization provided from the DNP amplification unit 161 may be provided to the measurement target 165 before being relaxed. As the DNP amplification unit 161 is separated from the measurement target 165, the structure of the low-field nuclear magnetic field device may be simplified and various types of measurement targets may be imaged.

According to a modified embodiment of the present invention, the FLL unit 110, the SQUID sensor unit 111, the SQUID signal controller 112, the Dewar 113, and the SQUID sensor controller 114 may be replaced by an optically-pumped atomic magnetometer (not shown). A nuclear magnetic resonance signal may be obtained using the optically-pumped atomic magnetometer. The optically-pumped atomic magnetometer may include a vapor cell containing alkali-metal (K, Rb, Cs) vapor, an optically-pumped laser to generate spin polarization of the alkali-metal vapor in the vapor cell, a linearly polarized laser applied to the vapor cell, and a detector capable of detecting the degree of polarization of laser beam passing through the vapor cell. A nuclear magnetic resonance signal may be obtained from the degree of polarization of laser beam passing through the vapor cell.

Figure 2:
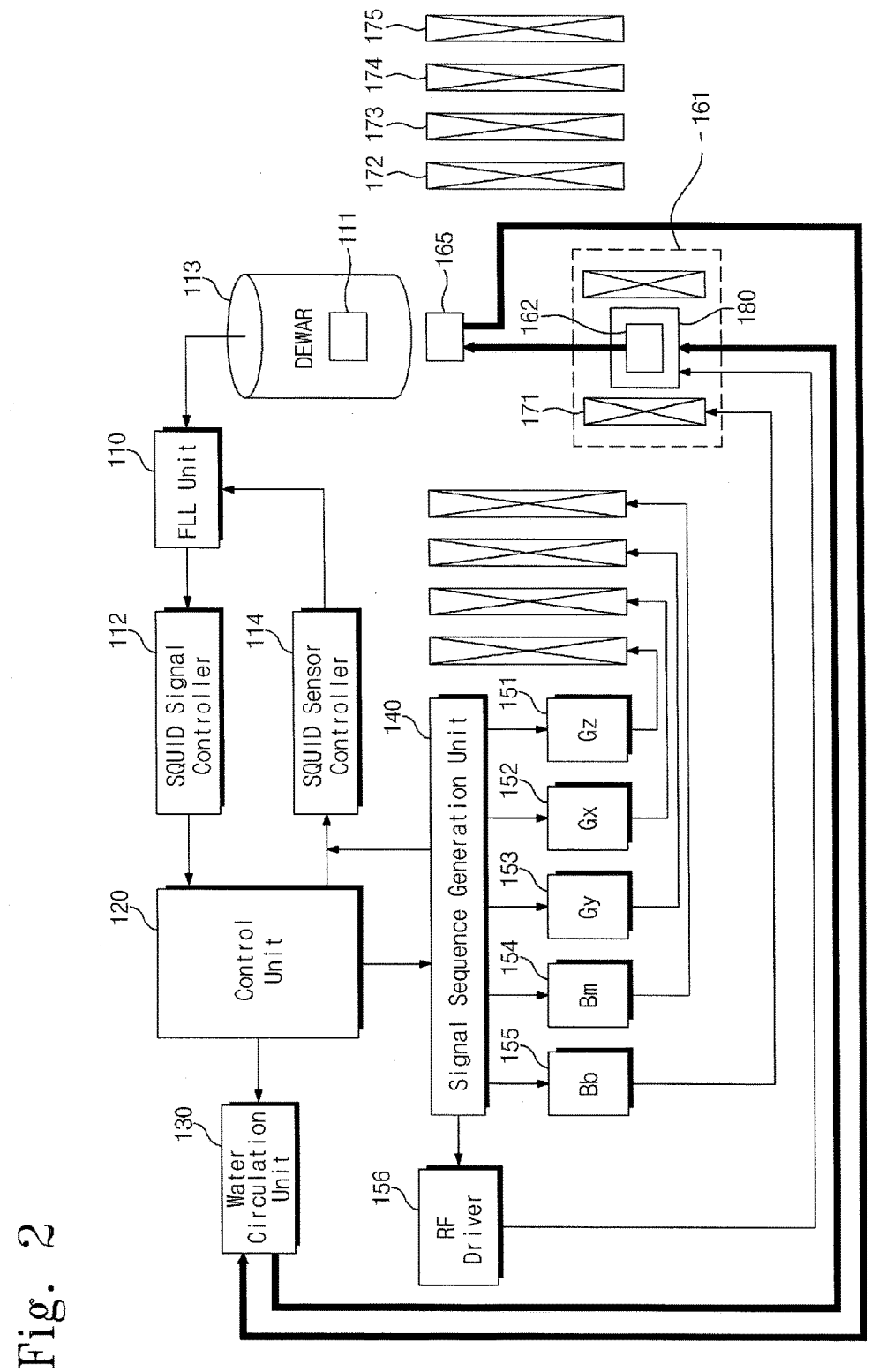
FIG. 2 illustrates a low-field nuclear magnetic resonance device according to another embodiment of the present invention.

FIG. 2 illustrates a low-field nuclear magnetic resonance device according to another embodiment of the present invention. In FIG. 2, sections different from FIG. 1 will be extensively described to avoid duplicate description.

Referring to FIG. 2, a DNP amplification unit 161 is disposed adjacent to a measurement target 165. Thus, signal decay caused by relaxation of amplified nuclear polarization of water may be reduced while providing the amplified nuclear polarization provided from the DNP amplification unit.

Figure 3:
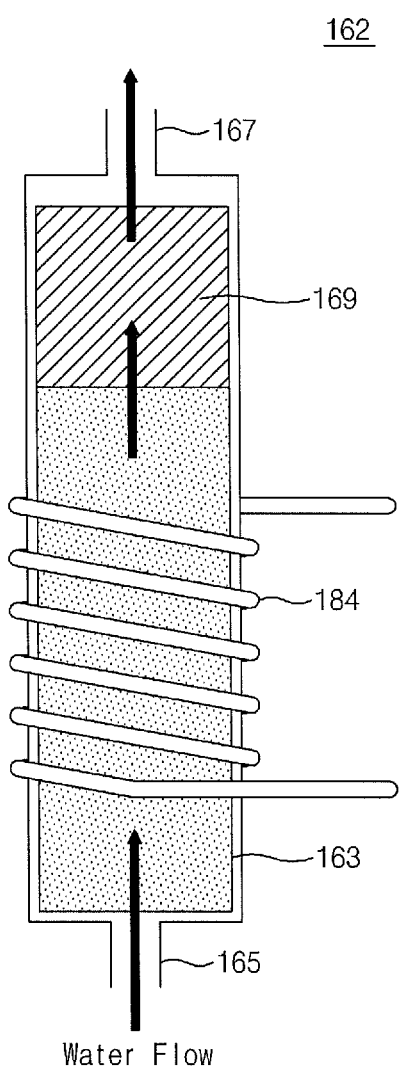
FIG. 3 illustrates a filter unit including an RF resonance coil.

FIG. 3 illustrates a filter unit including an RF resonance coil.

Referring to FIG. 3, a filter unit 162 may include a gel-filtration matrix 163 where a DNP substance is fixed, a DNP filter 169 to prevent permeation of the DNP substance, an inlet 165 to receive water, and an outlet 167 to supply the water to a measurement target.

The gel-filtration matrix 163 includes a DNP substance containing DNP-possible free radicals. The DNP substance may be TEMPO or TEMPL. An RF resonance coil 184 surrounds the gel-filtration matrix 163.

The gel-filtration matrix 163 may fix an $NH_2$ group of the TEMPO or an OH group of the TEMPOL using a Sepharose that is a kind of carrier for gel-filtration. A material to fix the TEMPO may be the NHS activated Sepharose 4 Fast Flow. In addition, a material to fix the TEMPO and the TEMPOL may be the epoxy-activated Sepharose 6B.

Figure 4:
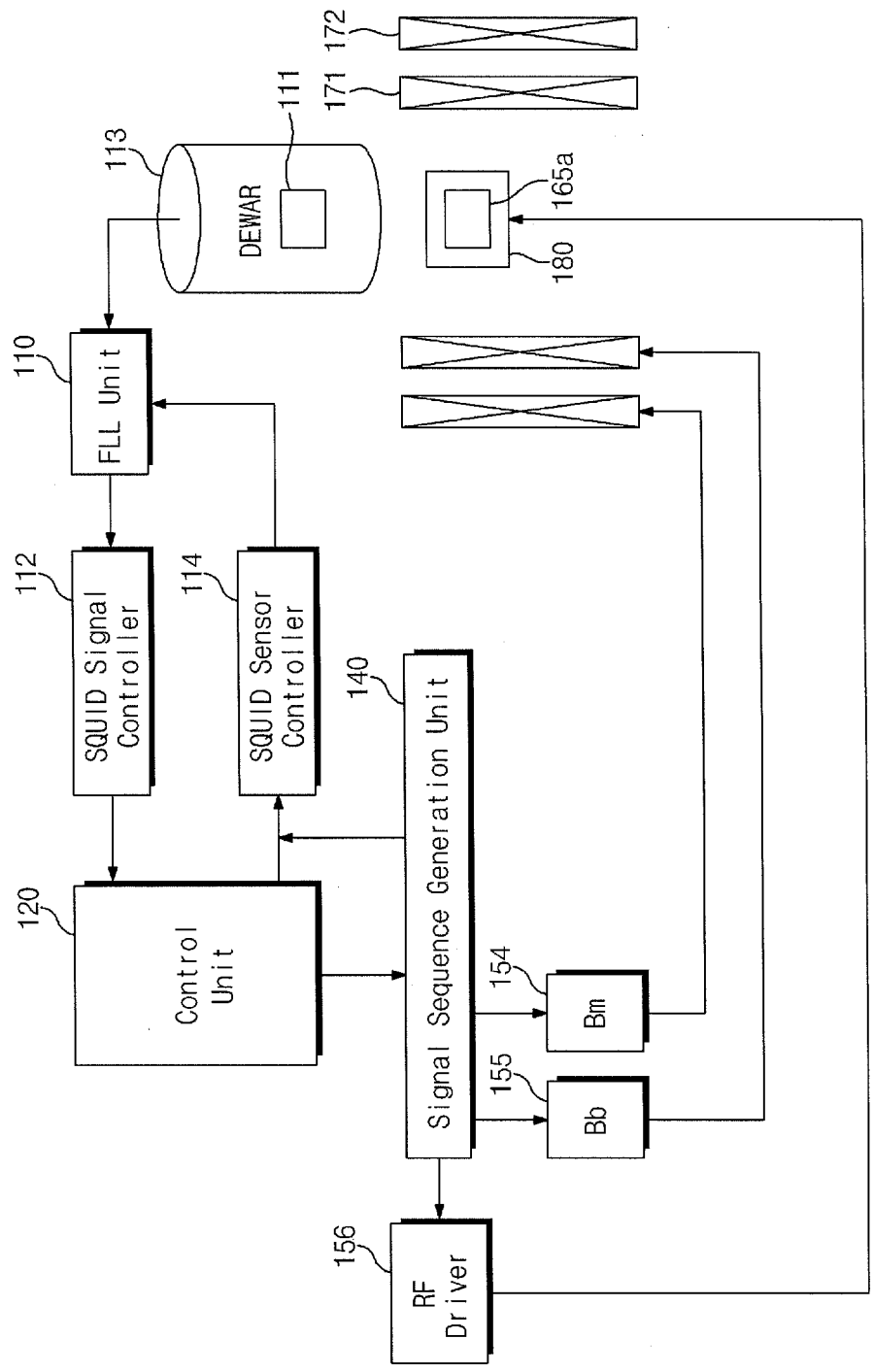
FIG. 4 illustrates a low-field nuclear magnetic resonance device according to further another embodiment of the present invention.

FIG. 4 illustrates a low-field nuclear magnetic resonance device according to further another embodiment of the present invention. In FIG. 4, sections different from FIG. 1 will be extensively described to avoid duplicate description.

Referring to FIG. 4, a DNP substance in an aqueous solution state may be directly injected to a measurement target 165a. However, if the DNP substance is injected into a human body or cell, biological safety cannot be guaranteed. However, if the measurement target is not a human, the DNP substance may be directly injected into the measurement target.

A nuclear magnetic resonance signal of hydrogen atoms was measured using the low-field magnetic resonance device. A bias magnetic field Bb of about 1.3 mT and an RF magnetic field (100 MHz) of 8 W or less were applied. TEMPO in an aqueous solution state was injected to the measurement target. In this case, it was observed that signal amplification was maximally eight times greater than using a conventional prepolarization magnetic field Bp.

In addition, when a bias magnetic field Bb of about 1.4 mT and an RF magnetic field (100 MHz) of 8 W or less were applied to the measurement target to which the TEMPOL in an aqueous solution state is injected, it was observed that signal amplification was maximally eight times greater than using a conventional prepolarization magnetic field Bp.

In addition, when a bias magnetic field Bb of about 7 mT and an RF magnetic field (150 MHz) of 8 W or less were applied to the measurement target to which the TEMPOL in an aqueous solution state is injected, signal amplification of about three times was observed. This matches a result obtained when a prepolarization magnetic field of 21 mT is applied in a conventional ULF-NMR test where an RF magnetic field is not applied. It is predicted that an output (about 8 W) of the RF magnetic field did not make sufficient electron spin resonance (ESR) transition. Thus, if the output of the RF magnetic field increases to tens to hundreds of watts (W), a signal may be amplified several hundred times or more. This may correspond to application of a prepolarization magnetic field of hundreds of mT in a ULF-NMR test. As a result, a weak bias magnetic field Bb is replaced with a prepolarization magnetic field to overcome disadvantages such as high manufacturing cost of a prepolarization coil and signal interference.

Figure 5:
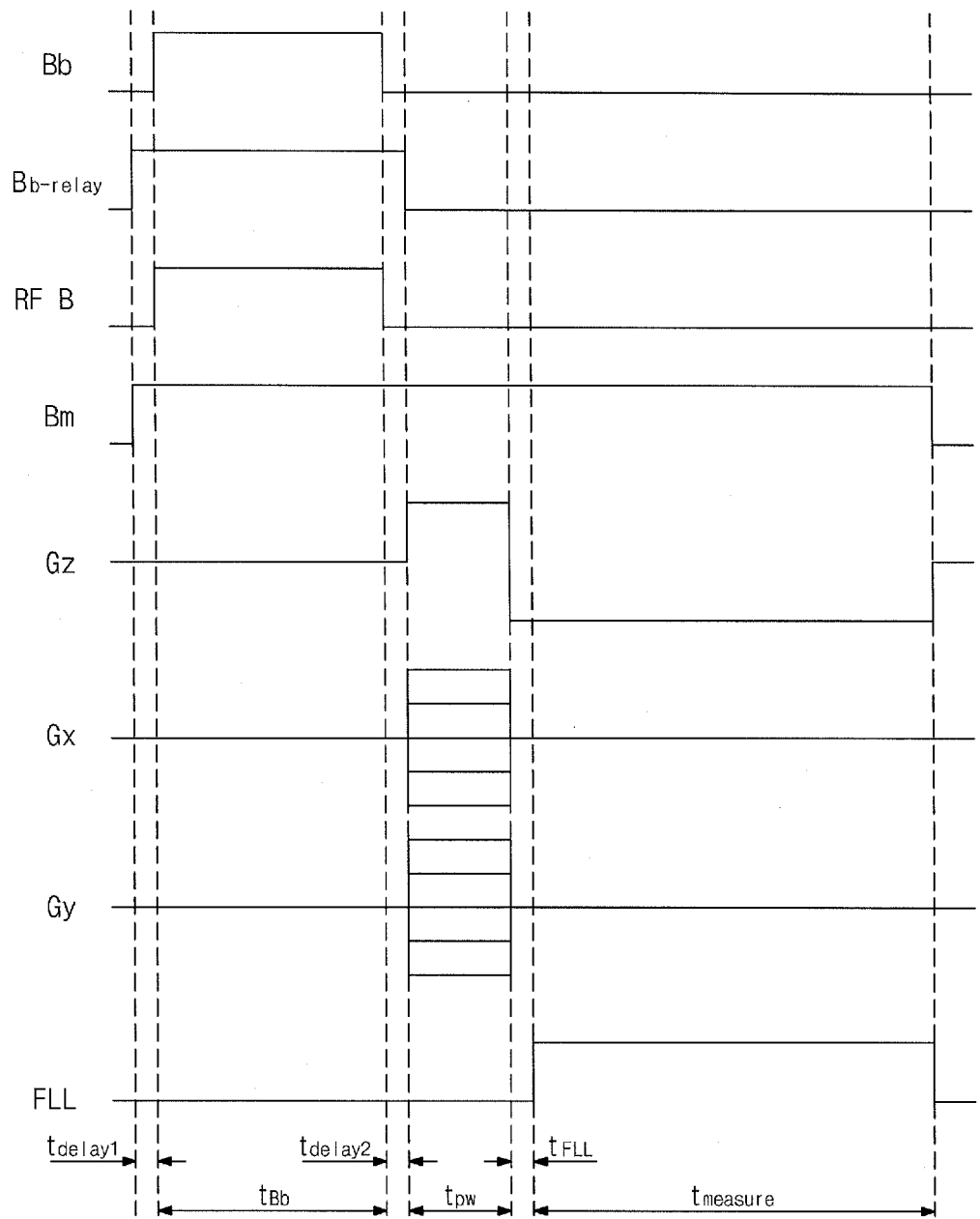
FIG. 5 illustrates a signal sequence of the low-field nuclear magnetic resonance device in FIG. 1 or 2.

FIG. 5 illustrates a signal sequence of the low-field nuclear magnetic resonance device in FIG. 1 or 2.

Referring to FIG. 5, a bias magnetic field (Bb) driver 155 may include a relay (not shown). The relay is closed and opened before and after a bias magnetic field Bb is applied to protect the bias magnetic field driver 155. There is predetermined delay time $t_{delay1}$ between turn-on of a relay signal $B_{b-relay}$ and turn-on of the bias magnetic field Bb. In addition, there is predetermined delay time $t_{delay2}$ between turn-off of a relay signal $B_{b-relay}$ and turn-off of the bias magnetic field Bb. The bias magnetic field is applied for certain time $t_{Bb}$.

A measurement magnetic field Bm is applied at the moment the relay is closed. A bias magnetic field Bb and an RF magnetic field (RF B) are always simultaneously turned on/off. When the relay is opened, first to third gradient magnetic fields Gx, Gy, and Gz are applied. After the lapse of certain time $t_{pw}$, a polarity of the third gradient magnetic field Gz is changed to an opposite polarity. At the same time, the first and second gradient magnetic fields Gx and Gy are turned off. And after the lapse of certain time $t_{FLL}$, an FLL switch FLL is turned on and a SQUID sensor measures a magnetic resonance signal. For predetermined measurement time $t_{measure}$, the magnetic resonance signal is measured and then the measurement magnetic field Bm, the FLL switch FLL, and the third gradient magnetic field Gz are turned off. The first and second gradient magnetic fields Gx and Gy providing location information of the measurement target are applied while their magnitudes are divided through many steps Nx and Ny. Thus, a repeated test is required to obtain three-dimensional imaging of the measurement target. The repeated test is repeatedly performed as many as times obtained by multiplying the step Nx of the first gradient magnetic field Gx by the step Ny of the second gradient magnetic field.

In case of two-dimensional imaging, the second gradient magnetic field Gy is not applied. In case of one-dimensional imaging, the first and second gradient magnetic fields Gx and Gy are not applied. The signal sequence may be variously modified.

Figure 6:
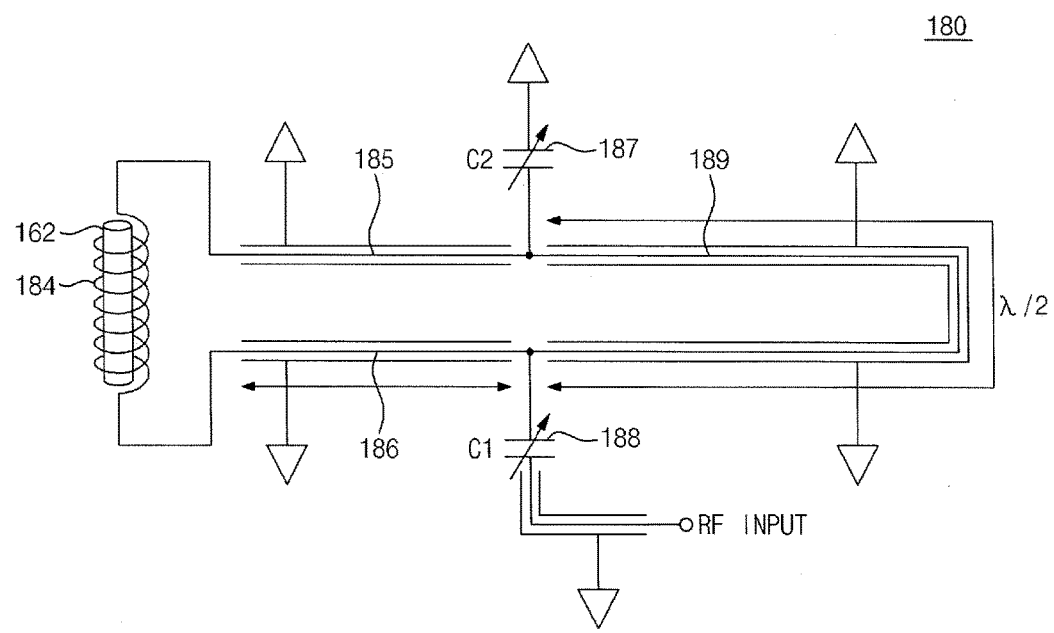
FIGS. 6 to 8 illustrate an RF resonance circuit part according to an embodiment of the present invention.

FIG. 6 illustrates an RF resonance part according to an embodiment of the present invention.

Referring to FIG. 6, an RF resonance circuit part 180 is a surface-type resonance circuit.

The RF resonance circuit part 180 includes an RF resonance coil 184 including at least one turn, a first extension 186 having one end connected to one end of the RF resonance coil 184 and being in the form of coaxial cable of length (l), a second extension 185 having one end connected to the other end of the RF resonance coil 184 and being in the form of coaxial cable of the same length (l) as the first extension 186, a first capacitor 188 coupled between the other end of the first extension 186 and an input terminal of an RF power source, a second capacitor 187 coupled between the other end of the second extension 185 and a ground terminal, and a third extension 189 being in the form of coaxial cable connected to the other end of the first extension 186 and the other end of the second extension 185. The length of the first extension 189 may be a half-wavelength of a driving RF power source.

The length (l) of the first extension 186 and the second extension 185 and the length of the third extension are decided according to a driving frequency of the driving RF power source. The driving frequency corresponds to an electron spin resonance (ESR) resonance frequency of a DNP substance, and a value of the driving frequency is in proportion to the magnitude of a bias magnetic field Bb. When the magnitude of the bias magnetic field Bb is several mT, the value of the driving frequency may be tens to hundreds of MHz.

$$l = \frac{\lambda}{2\pi}\tan^{-1}\frac{276\log_{10}(b/a)}{2\pi fL\sqrt{\varepsilon}}  \qquad \text{Equation (1)}$$

wherein λ represents a wavelength, L represents inductance of a coil, f represents a driving frequency, a represents an outer radius of inner conductor of a coaxial cable, b represents an inner radius of outer conductor of the coaxial cable, and ∈ represents a dielectric constant of an insulating layer of the coaxial cable.

Figure 7:
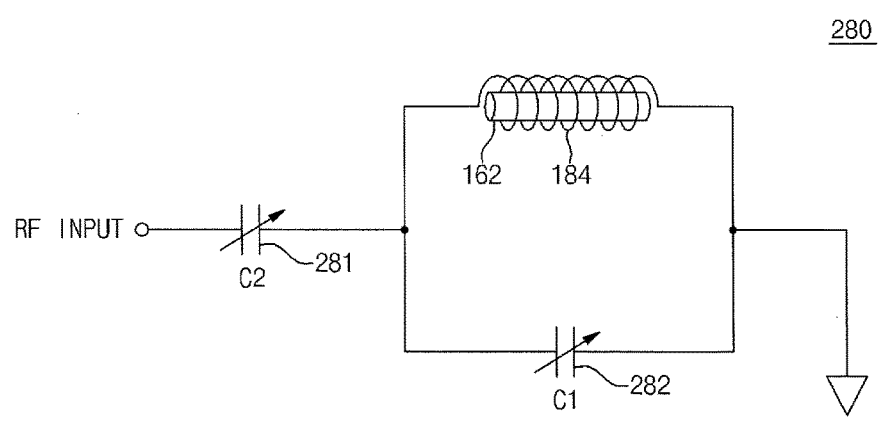
Figure 8:
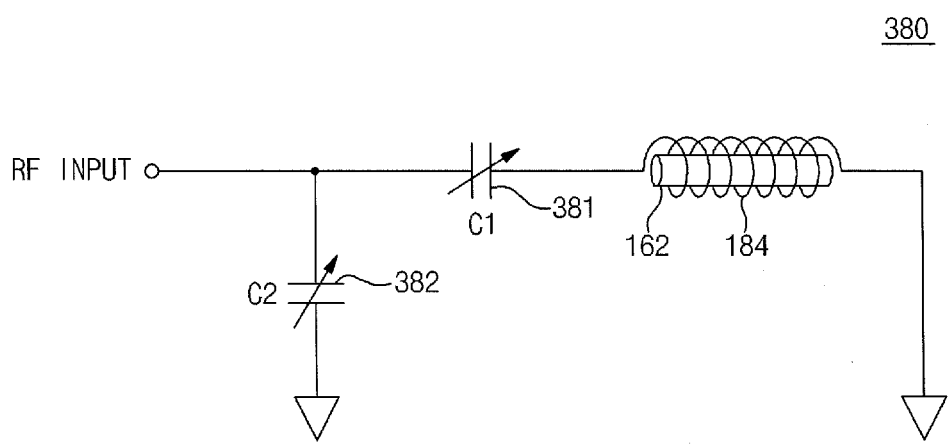

FIGS. 7 and 8 illustrate RF resonance circuit parts according to other embodiments of the present invention, respectively.

Referring to FIG. 7, an RF resonance circuit part 280 includes an RF resonance coil 184 including at least one turn, a first capacitor 282 connected in parallel with the RF resonance coil 184, and a second capacitor 281 having one end connected to one end of the RF resonance coil 184 and one end of the first capacitor 282. The other end of the RF resonance coil 184 and the other end of the first capacitor 282 are grounded, and the other end of the second capacitor 281 is connected to an input terminal of a driving RF power source.

Referring to FIG. 8, an RF resonance circuit part 380 includes an RF resonance coil 184 including at least one turn, a first capacitor 381 having one end connected in series to one end of the RF resonance coil 184, and a second capacitor 382 coupled between the other end of the first capacitor 381 and a ground. The other end of the RF resonance coil 184 is grounded, and the other end of the first capacitor 381 is connected to an input terminal of a driving RF power source.

Figure 9:
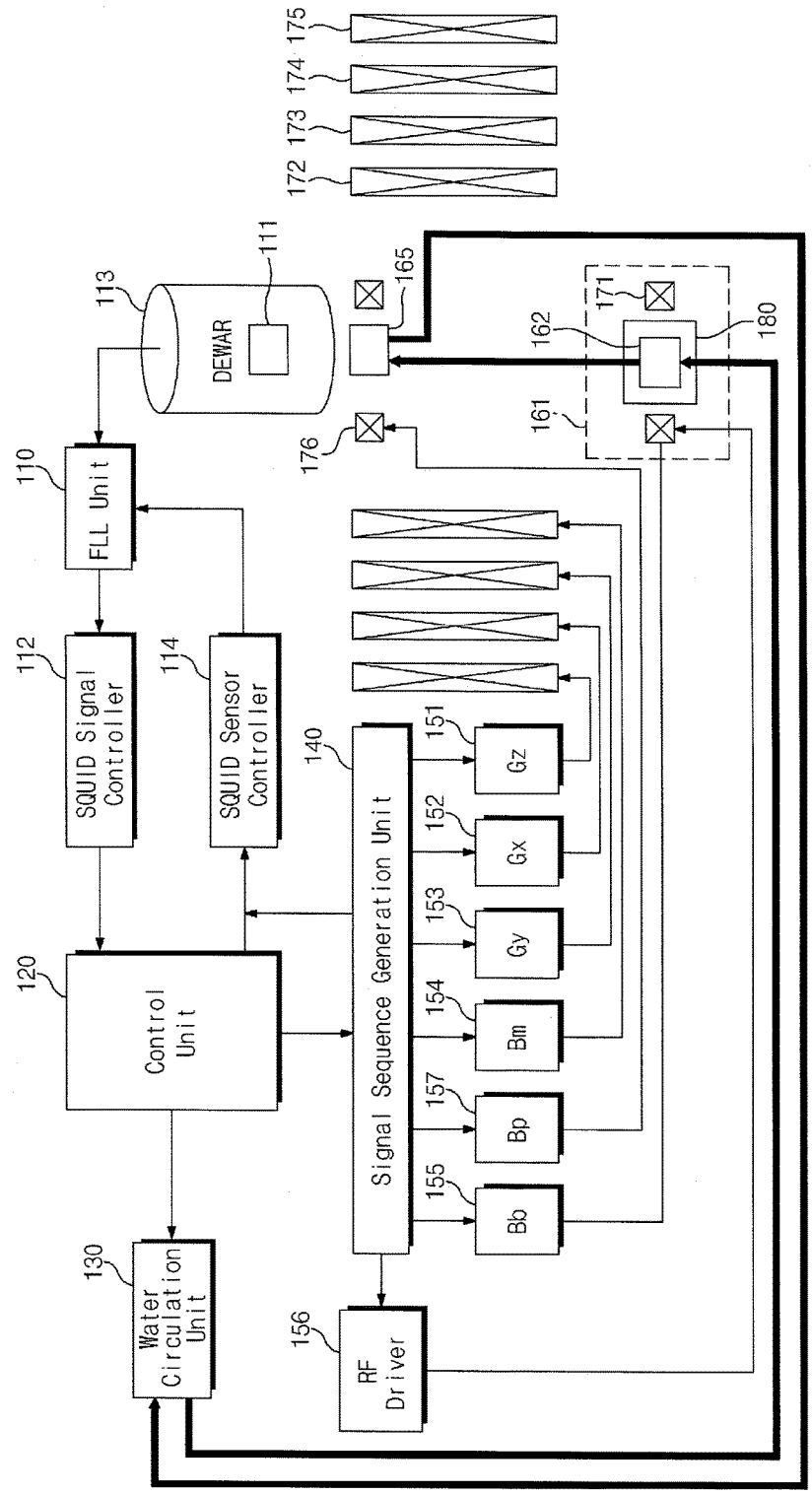
FIG. 9 illustrates a low-field nuclear magnetic resonance device according to still another embodiment of the present invention.

FIG. 9 illustrates a low-field nuclear magnetic resonance device according to still another embodiment of the present invention. In FIG. 9, sections different from FIG. 1 will be extensively described to avoid duplicate description.

Referring to FIG. 9, similar to a conventional low-field nuclear magnetic resonance device, the low-field magnetic nuclear magnetic resonance device may include a prepolarization coil 176 and a prepolarization coil driver 157. The prepolarization coil 176 may be disposed around a measurement target 165 to provide a prepolarization magnetic field Bp to the measurement target 165. Thus, the preplarization magnetic field Bp may realign amplified nuclear polarization in a prepolarization magnetic field direction.

According to the present invention described above, a low-field nuclear magnetic resonance device can obtain a magnetic resonance signal through signal amplification using DNP without a prepolarization magnetic field.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the present invention.

What is claimed is:

1. A low-field nuclear magnetic resonance device comprising:
   a dynamic nuclear polarization (DNP) amplification unit to amplify a nuclear polarization of hydrogen atoms of water using a DNP-possible substance (DNP substance) to provide an amplified nuclear polarization to a measurement target;
   a sensor unit to measure a magnetic resonance signal of the measurement target using a SQUID sensor or an optically-pumped atomic magnetometer; and
   a measurement magnetic field coil to apply a measurement magnetic field to the measurement target,
   wherein the DNP amplification unit comprises:
   a bias magnetic field coil to apply a bias magnetic field to the DNP substance and water;
   a filter unit disposed inside the bias magnetic field coil and including a gel-filtration matrix to provide the amplified nuclear polarization of water to the measurement target; and
   an RF resonance circuit part including an RF resonance coil disposed around the gel-filtration matrix, and
   wherein the DNP amplification unit is separated from the measurement target, the sensor unit, and the measurement magnetic field coil,
   wherein the DNP amplification unit is configured to simultaneously turn on/off the bias magnetic field and an RF magnetic field generated by the RF resonance coil.

2. The low-field nuclear magnetic resonance device of claim 1, wherein the DNP amplification unit further comprises a water circulation unit to supply water to the gel-filtration matrix.

3. The low-field nuclear magnetic resonance device of claim 1, wherein the filter unit comprises:
   a gel-filtration matrix where the DNP substance is fixed;
   a DNP filter to prevent a permeation of the DNP substance;
   an inlet to receive water; and
   an outlet to supply water to the measurement target.

4. The low-field nuclear magnetic resonance device of claim 3, wherein the gel-filtration matrix fixes an $NH_2$ group of TEMPO or an OH group of TEMPOL using a Sepharose which is a kind of carrier for gel-filtration.

5. The low-field nuclear magnetic resonance device of claim 4, wherein the gel-filtration matrix uses an NHS activated Sepharose 4 Fast Flow as a material to fix the TEMPO.

6. The low-field nuclear magnetic resonance device of claim 4, wherein the gel-filtration matrix uses an epoxy-activated Sepharose 6B as a material to fix the TEMPO and the TEMPOL.

7. The low-field nuclear magnetic resonance device of claim 1, wherein the DNP substance is TEMPO or TEMPOL.

8. The low-field nuclear magnetic resonance device of claim 1, wherein water which has the amplified nuclear-polarization by passing through the gel-filtration matrix is continuously or intermittently supplied to the measurement target.

9. The low-field nuclear magnetic resonance device of claim 1, wherein the DNP amplification unit is disposed outside the measurement magnetic field coil.

10. A low-field nuclear magnetic resonance device comprising:
    a dynamic nuclear polarization (DNP) amplification unit to amplify a nuclear polarization of hydrogen atoms of water using a DNP-possible substance (DNP substance) to provide an amplified nuclear polarization to a measurement target;
    a sensor unit to measure a magnetic resonance signal of the measurement target using a SQUID sensor or an optically-pumped atomic magnetometer; and
    a measurement magnetic field coil to apply a measurement magnetic field to the measurement target,
    wherein the DNP amplification unit comprises:
    a bias magnetic field coil to apply a bias magnetic field to a DNP substance in an aqueous solution state; and
    an RF resonance circuit part including an RF resonance coil disposed around the bias magnetic field coil, and
    wherein the measurement target includes the DNP substance in the aqueous solution state,
    wherein the DNP amplification unit is configured to simultaneously turn on/off the bias magnetic field and an RF magnetic field generated by the RF resonance coil.

11. A low-field nuclear magnetic resonance device comprising:
    a dynamic nuclear polarization (DNP) amplification unit to amplify a nuclear polarization of hydrogen atoms of water using a DNP-possible substance (DNP substance) to provide an amplified nuclear polarization to a measurement target;
    a sensor unit to measure a magnetic resonance signal of the measurement target using a SQUID sensor or an optically-pumped atomic magnetometer; and
    a measurement magnetic field coil to apply a measurement magnetic field to the measurement target,
    wherein the DNP amplification unit comprises:
    a bias magnetic field coil to apply a bias magnetic field to the DNP substance and water;
    a filter unit disposed inside the bias magnetic field coil and including a gel-filtration matrix to provide the amplified nuclear polarization of water to the measurement target; and
    an RF resonance circuit part including an RF resonance coil disposed around the gel-filtration matrix, and
    wherein the DNP amplification unit, the measurement target, the sensor unit, and the measurement magnetic field coil are disposed spatially adjacent to each other to reduce a signal decay caused by a relaxation of the amplified nuclear polarization of water while providing the amplified nuclear polarization of water,
    wherein the DNP amplification unit is configured to simultaneously turn on/off the bias magnetic field and an RF magnetic field generated by the RF resonance coil.

12. The low-field nuclear magnetic resonance device of claim 1, wherein the bias magnetic field has a magnitude of several milliTesla (mT).

13. The low-field nuclear magnetic resonance device of claim 1, further comprising at least one of the following:
    a gradient magnetic field coil to provide a gradient magnetic field to the measurement target; and
    a prepolarization coil to prepolarize the measurement target.

14. The low-field nuclear magnetic resonance device of claim 1, which does not comprise a prepolarization magnetic field to prepolarize the measurement target.

15. The low-field nuclear magnetic resonance device of claim 1, wherein the RF resonance circuit part comprises:
    the RF resonance coil including at least one turn;
    a first extension having one end connected to one end of the RF resonance coil and being in the form of a coaxial cable;
    a second extension having one end connected to the other end of the RF resonance coil and being in the form of a coaxial cable having a same length of/as the first extension;
    a first capacitor coupled between the other end of the first extension and an input terminal of an RF power source;
    a second capacitor coupled between the other end of the second extension and a ground terminal; and
    a third extension being in the form of a coaxial cable connected to the other end of the first extension and the other end of the second extension,
    wherein a length of the third extension is a half-wavelength of a driving RF power source.

16. The low-field nuclear magnetic resonance device of claim 1, wherein the RF resonance circuit part comprises:
    the RF resonance coil including at least one turn;
    a first capacitor connected in parallel with the RF resonance coil; and
    a second capacitor connected to one end of the RF resonance coil and one end of the first capacitor,
    wherein the other end of the RF resonance coil and the other end of the first capacitor are grounded, and the other end of the second capacitor is connected to an input terminal of a driving RF power source.

17. The low-field nuclear magnetic resonance device of claim 1, wherein the RF resonance circuit part comprises:
    the RF resonance coil including at least one turn;
    a first capacitor having one end connected in series to one end of the RF resonance coil; and
    a second capacitor coupled between the other end of the first capacitor and a ground,
    wherein the other end of the RF resonance coil is grounded, and the other end of the first capacitor is connected to an input terminal of a driving RF power source.

* * * * *

UNITED STATES PATENT AND TRADEMARK OFFICE
CERTIFICATE OF CORRECTION

| | | |
|---|---|---|
| PATENT NO. | : 9,903,925 B2 | Page 1 of 1 |
| APPLICATION NO. | : 13/921724 | |
| DATED | : February 27, 2018 | |
| INVENTOR(S) | : Kim et al. | |

It is certified that error appears in the above-identified patent and that said Letters Patent is hereby corrected as shown below:

Column 12, Line 31, (within Claim 15):
Replace "of/as"
With -- of $l$ as --.

Signed and Sealed this
Fifth Day of June, 2018

Andrei Iancu
*Director of the United States Patent and Trademark Office*